US011551909B2

(12) United States Patent
Lane et al.

(10) Patent No.: US 11,551,909 B2
(45) Date of Patent: Jan. 10, 2023

(54) ULTRA-LOCALIZED AND PLASMA UNIFORMITY CONTROL IN A PLASMA PROCESSING SYSTEM

(71) Applicant: Tokyo Electron Limited, Tokyo (JP)

(72) Inventors: Barton G. Lane, Austin, TX (US); Peter L. G. Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 379 days.

(21) Appl. No.: 15/723,005

(22) Filed: Oct. 2, 2017

(65) Prior Publication Data

US 2019/0103254 A1 Apr. 4, 2019

(51) Int. Cl.
*H01J 37/32* (2006.01)
*H01L 21/67* (2006.01)
*H01L 21/683* (2006.01)

(52) U.S. Cl.
CPC ........ *H01J 37/3222* (2013.01); *H01J 37/321* (2013.01); *H01J 37/3244* (2013.01);
(Continued)

(58) Field of Classification Search
CPC .............. H01J 37/32091; H01J 37/321; H01J 37/3211; H01J 37/32174; H01J 37/32477; H01J 37/32495; H01J 37/32541; H01J 37/32559; H01J 37/32568; H01J 37/32605; H01J 37/32623; H01J 37/32385; H01J 37/32715; H01J 37/3244; H01J 2237/3344; H01J 37/32; H01J 37/32082; H01J 37/32532; H01J 37/32155; H01J 37/32165; H01J 37/32366; H01J 37/32577; H01J 37/3222; H01L 21/67069; H01L 21/6831; H01L 21/67109; C23C 16/4404; C23C 16/458; C23C 16/4585; C23C 16/50; C23C 16/505; C23C 16/507; C23C 16/509; C23C 16/5093; C23C 16/517
See application file for complete search history.

(56) References Cited

U.S. PATENT DOCUMENTS 2,997,294 A * 8/1961 Gitzendanner ........ H01G 13/00
270/58.04
4,864,464 A * 9/1989 Gonzalez .......... H01L 27/10805
361/311

(Continued)

FOREIGN PATENT DOCUMENTS

JP 2007-258570 A 10/2007
JP 2017-004602 A 1/2017

(Continued)

OTHER PUBLICATIONS

Merriam-Webster Dictionary Definition: loop.*

(Continued)

*Primary Examiner* — Benjamin Kendall
*Assistant Examiner* — Kurt Sweely
(74) *Attorney, Agent, or Firm* — Oblon, McClelland, Maier & Neustadt, L.L.P.

(57) ABSTRACT

Described herein are architectures, platforms and methods for providing localized high density plasma sources igniting local gasses during a wafer fabrication process to provide global uniformity. Such plasma sources are resonant structures operating at radio frequencies at or higher than microwave values.

20 Claims, 5 Drawing Sheets

(52) U.S. Cl.
CPC ... *H01J 37/32385* (2013.01); *H01J 37/32091* (2013.01); *H01J 37/32715* (2013.01); *H01L 21/67069* (2013.01); *H01L 21/6831* (2013.01)

(56) References Cited

U.S. PATENT DOCUMENTS

| | | | |
|---|---|---|---|
| 6,178,920 B1 * | 1/2001 | Ye | H01J 37/321 |
| | | | 118/732 I |
| 6,353,206 B1 * | 3/2002 | Roderick | H01J 37/32082 |
| | | | 219/121.52 |
| 6,552,296 B2 * | 4/2003 | Smith | H01J 27/16 |
| | | | 219/121.41 |
| 7,100,532 B2 | 9/2006 | Pribyl | |
| 7,976,674 B2 * | 7/2011 | Brcka | H01J 37/32082 |
| | | | 118/723 AN |
| 9,099,503 B2 | 8/2015 | Iwata | |
| 9,293,299 B2 | 3/2016 | Yamazawa | |
| 9,368,328 B2 | 6/2016 | Ozimek et al. | |
| 9,881,772 B2 | 1/2018 | Marakhatanov et al. | |
| 10,020,167 B2 | 7/2018 | Yamazawa | |
| 2009/0101283 A1 | 4/2009 | Iwata | |
| 2010/0012029 A1 | 1/2010 | Forster et al. | |
| 2011/0240222 A1 * | 10/2011 | Sawada | H01J 37/321 |
| | | | 156/345.28 |
| 2012/0074100 A1 * | 3/2012 | Yamazawa | H01J 37/321 |
| | | | 216/68 |
| 2012/0247679 A1 | 10/2012 | Yamazawa | |
| 2013/0059415 A1 * | 3/2013 | Kato | C23C 16/345 |
| | | | 438/106 |
| 2013/0260567 A1 | 10/2013 | Marakhtanov et al. | |
| 2014/0175055 A1 * | 6/2014 | Sasagawa | H01J 37/321 |
| | | | 216/68 |
| 2015/0206711 A1 | 7/2015 | Ozimek et al. | |
| 2015/0380281 A1 * | 12/2015 | Sriraman | H01J 37/3244 |
| | | | 438/710 |
| 2016/0155613 A1 | 6/2016 | Yamazawa | |
| 2017/0213734 A9 | 7/2017 | Marakhtanov et al. | |

FOREIGN PATENT DOCUMENTS

| | | |
|---|---|---|
| TW | 201435961 A | 9/2014 |
| WO | 2009/093459 A1 | 7/2009 |

OTHER PUBLICATIONS

Wayback machine capture of "General Capacitor Variants in Use Today", capture from May 2, 2012 (see p. 3/21) (Year: 2012).*
International Search Report dated Feb. 1, 2019 in PCT/US2018/053373, 3 pages.
Written Opinion of the International Searching Authority dated Feb. 1, 2019 in PCT/US2018/053373, 4 pages.
Office Action dated Jul. 12, 2022 in Japanese Patent Application No. 2020-518717, along with an English Translation, (14 pgs).
Office Action dated Sep. 8, 2022 in related Taiwanese Patent Application No. 107134238, along with an English translation.

* cited by examiner

ULTRA-LOCALIZED AND PLASMA UNIFORMITY CONTROL IN A PLASMA PROCESSING SYSTEM

BACKGROUND

Semiconductor wafer die fabrication processes, including film etching processes during pattern transfer, may be subject to many problems affecting wafer die yield, productivity, reliability, and cost. Such problems can become more prevalent as patterns become smaller and tolerances become more constrained. Such tolerances can relate to line uniformity (e.g., width, depth, straightness) and critical dimensions (CD) of etch patterns. In plasma fabrication processes, issues can arise due to global plasma non-uniformity. More plasma uniformity may be present towards the center of the wafer die than the edge, due to the material/electrical discontinuity at the wafer edge. As an example, the region near the edge of the wafer die can have fluxes of radicals and charged species which differ strongly from fluxes of those species at the wafer die center, since the wafer substrate edge marks a discontinuous electrical and material boundary.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Described herein are architectures, platforms and methods for localization of high density plasma sources during a wafer fabrication process. Such local high density plasma sources may be auxiliary to a primary plasma source. Particular implementations can include an array of controlled localized plasma sources. For example, groups of plasma sources or elements of an array can be controlled as a unit or individual plasma sources or elements can be controllable. When controlling a group of array plasma sources or elements as a single unit, a constant relative power is delivered to the array plasma sources or elements to assure that total power allotted to the array is divided among the plasma sources or elements in a controllable manner. The arrays of plasma sources may cover a restricted portion of a reactor surface in order to locally control the plasma density in their vicinity or may cover substantial areas such as the entire top surface facing the wafer which is being processed.

Figure 1:
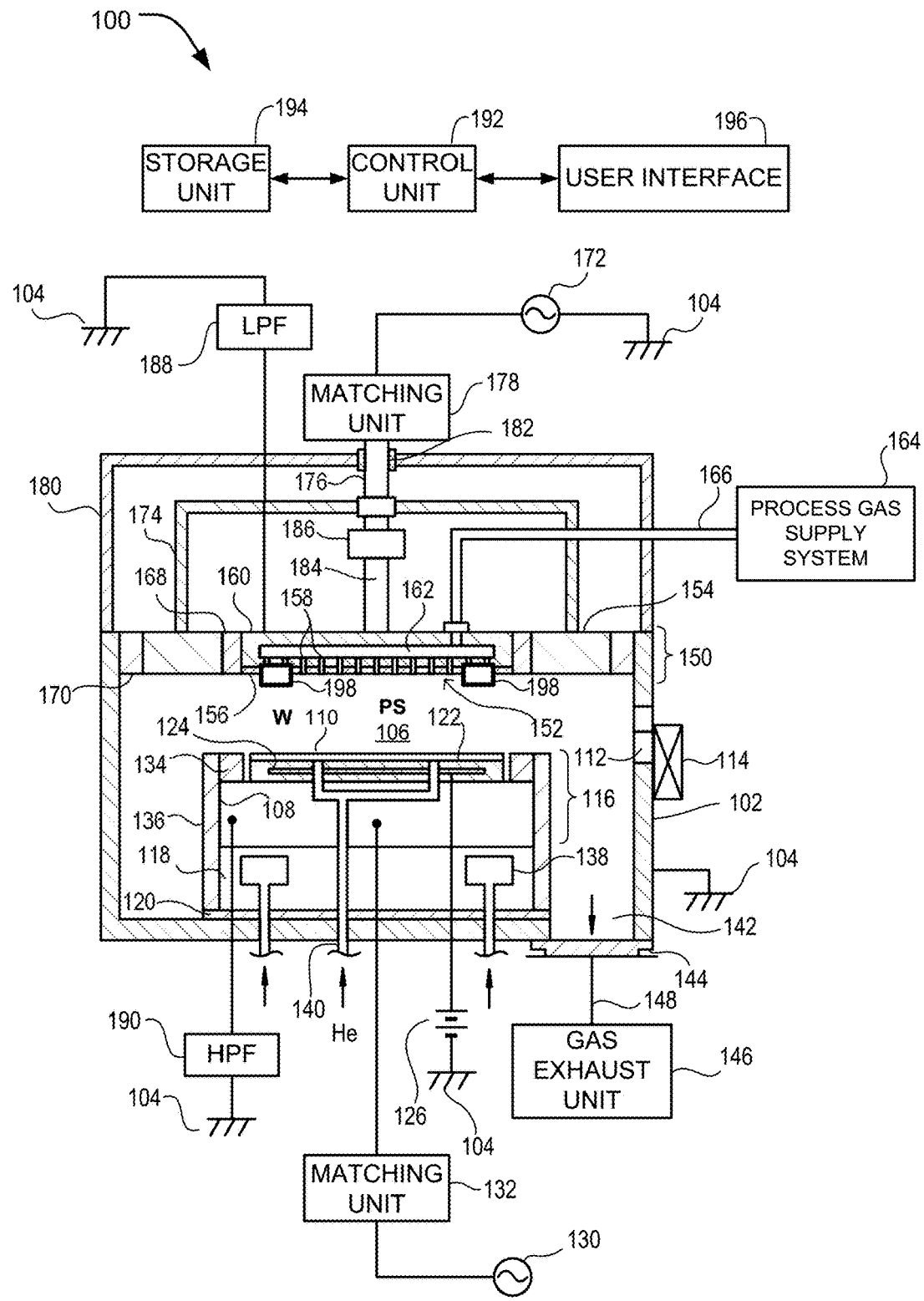
FIG. 1 is a cross-sectional view showing an example schematic configuration of a capacitively coupled plasma (CCP) processing system as described in accordance with embodiments herein.

FIG. 1 shows a schematic cross-sectional view of an example of a capacitively coupled plasma (CCP) processing apparatus or plasma processing system 100 in accordance with embodiments herein. It is to be understood that other processing systems can be implemented, such as radial line slot antenna (RLSA) and inductively coupled plasma (ICP) processing systems. In particular implementations, the plasma processing system 100 is used for wafer fabrication processes. In certain implementations, the apparatus is considered as generating plasma and is part of the plasma processing system 100. Described herein are implementations and variations using a primary plasma source with auxiliary localized plasma sources and distributed localized plasma sources. Such plasma sources are used for exciting and dissociating gases during a wafer fabrication process and creating ions which are accelerated towards the wafer by sheaths formed by the plasma. An array of such localized plasma sources can also constitute the primary or sole plasma source. Such arrays of structures may be part of or included in the apparatus.

The plasma processing system 100 may be used for multiple operations including ashing, etching, deposition, cleaning, plasma polymerization, plasma-enhanced chemical vapor deposition (PECVD), plasma-enhanced atomic layer deposition (PEALD) and so forth. Plasma processing can be executed within plasma processing chamber 102, which can be a vacuum chamber made of a metal such as aluminum or stainless steel. The plasma processing chamber 102 is grounded such to ground(s) 104. The plasma processing chamber 102 defines a processing vessel providing a process space PS 106 for plasma generation. An inner wall of the plasma processing chamber 102 can be coated with alumina, yttria, or other protectant. The plasma processing chamber 102 can be cylindrical in shape or have other geometric configurations.

At a lower, central area within the plasma processing chamber 102, a substrate holder or susceptor 108 (which can be disc-shaped) can serve as a mounting table on which, for example, a substrate W 110 to be processed (such as a semiconductor wafer) can be mounted. Substrate W 110 can be moved into the plasma processing chamber 102 through loading/unloading port 112 and gate valve 114. Susceptor 108 forms part of a lower electrode 116 (lower electrode assembly) as an example of a second electrode acting as a mounting table for mounting substrate W 110 thereon. Specifically, the susceptor 108 is supported on a susceptor support 118, which is provided at substantially a center of the bottom of plasma processing chamber 102 via an insulating plate 120. The susceptor support 118 can be cylindrical. The susceptor 108 can be formed of, e.g., an aluminum alloy. Susceptor 108 is provided thereon with an electrostatic chuck 122 (as part of the lower electrode assembly 116) for holding the substrate W 110. Electrostatic chuck 122 may be considered a substrate chuck. The electrostatic chuck 122 is provided with an electrode 124. Electrode 124 is electrically connected to DC power source 126 (direct current power source). The electrostatic chuck 122 attracts the substrate W 110 thereto via an electrostatic force generated when DC voltage from the DC power source 126 is applied to the electrode 124.

The susceptor 108 can be electrically connected with a high-frequency power source 130 via a matching unit 132. This high-frequency power source 130 (a second power source) can output a high-frequency voltage in a range from, for example, 4 MHz to 12 MHz. Applying high frequency bias power causes ions, in the plasma, generated in the plasma processing chamber 102, to be attracted to substrate W 110. A focus ring 134 is provided on an upper surface of the susceptor 108 to surround the electrostatic chuck 122.

In certain implementations, for localized plasma sources, as described below, high frequency voltage can be provided at the VHF band (30 MHz to 300 MHz), UHF band (300 MHz to 1 GHz), L band (1-2 GHz), S band (2 GHz to 4 GHz), or the C band (4 GHz to 8 GHz) or the X band (8 GHz to 12 GHz). The high frequency voltage for localized plasma sources can be provided through RF or microwave power (not shown) to the plasma processing chamber 102.

An inner wall member 136, which can be cylindrical and formed of, e.g., quartz, is attached to the outer peripheral side of the electrostatic chuck 122 and the susceptor support 118. The susceptor support 118 includes a coolant flow path 138. The coolant flow path 138 communicates with a chiller unit (not shown), installed outside the plasma processing chamber 102. Coolant flow path 138 is supplied with coolant (cooling liquid or cooling water) circulating through corresponding lines. Accordingly, a temperature of the substrate W 110 mounted on/above the susceptor 108 can be accurately controlled. A gas supply line 140, which passes through the susceptor 108 and the susceptor support 118, is configured to supply heat transfer gas to an upper surface of the electrostatic chuck 122. A heat transfer gas (also known as backside gas) such as helium (He) can be supplied between the substrate W 110 and the electrostatic chuck 122 via the gas supply line 140 to assist in heating substrate W 110.

An exhaust path 142 can be formed along an outer periphery of inner wall member 136 and an inner sidewall surface of the plasma processing chamber 102. An exhaust port 144 (or multiple exhaust ports) is provided in a bottom portion of the exhaust path 142. A gas exhaust unit 146 is connected to each exhaust port via gas exhaust line 148. The gas exhaust unit 146 can include a vacuum pump such as a turbo molecular pump configured to decompress the plasma processing space within the plasma processing chamber 102 to a desired vacuum condition. The gas exhaust unit 146 evacuates the inside of the plasma processing chamber 102 to thereby depressurize an inner pressure thereof up to a desired degree of vacuum.

An upper electrode 150 (that is, an upper electrode assembly), is an example of a first electrode and is positioned vertically above the lower electrode 116 to face the lower electrode 116 in parallel. For a primary plasma source, the plasma generation space or process space PS 106 is defined between the lower electrode 116 and the upper electrode 150. The upper electrode 150 includes an inner upper electrode 152 having a disk shape, and an outer upper electrode 154 which can be annular and surround a periphery of the inner upper electrode 152. The inner upper electrode 152 also functions as a processing gas inlet for injecting a specific amount of processing gas into the process space PS 106 above substrate W 110 mounted on the lower electrode 116.

More specifically, the inner upper electrode 152 includes electrode plate 156 (which is typically circular) having gas injection openings 158. Inner upper electrode 152 also includes an electrode support 160 detachably supporting an upper side of the electrode plate 156. The electrode support 160 can be formed in the shape of a disk having substantially a same diameter as the electrode plate 156 (when electrode plate 156 is embodied as circular in shape). In alternative embodiments, electrode plate 156 can be square, rectangular, polygonal, etc. The electrode plate 156 can be formed of a conductor or semiconductor material, such as Si, SiC, doped Si, Aluminum, and so forth. The electrode plate 156 can be integral with upper electrode 150 or detachably supported by electrode support 160 for convenience in replacing a given plate after surface erosion. The upper electrode 150 can also include a cooling plate or cooling mechanism (not shown) to control temperature of the electrode plate 156.

The electrode support 160 can be formed of, e.g., aluminum, and can include a buffer chamber 162. Buffer chamber 162 is used for diffusing process gas and can define a disk-shaped space. Processing gas from a process gas supply system 164 supplies gas to the upper electrode 150. The process gas supply system 164 can be configured to supply a processing gas for performing specific processes, such as film-forming, etching, and the like, on the substrate W 110. The process gas supply system 164 is connected with a gas supply line 166 forming a processing gas supply path. The gas supply line 166 is connected to the buffer chamber 162 of the inner upper electrode 152. The processing gas can then move from the buffer chamber 162 to the gas injection openings 158 at a lower surface thereof. A flow rate of processing gas introduced into the buffer chamber 162 can be adjusted by, e.g., by using a mass flow controller. Further, the processing gas introduced is uniformly discharged from the gas injection openings 158 of the electrode plate 156 (showerhead electrode) to the process space PS 106. The inner upper electrode 152 then functions in part to provide a showerhead electrode assembly. For localized plasma sources, separate gas outlet holes may be local to the localized plasma sources or elements of an array of elements. In certain embodiments, the array is disposed around electrostatic or substrate chuck 122.

A dielectric 168, having a ring shape, can be interposed between the inner upper electrode 152 and the outer upper electrode 154. An insulator 170, which can be a shield member having a ring shape and being formed of, e.g., alumina, is interposed between the outer upper electrode 154 and an inner peripheral wall of the plasma processing chamber 102 in an air tight manner.

In an implementation, the outer upper electrode 154 is electrically connected with a high-frequency power source 172 (first high-frequency power source) via a power feeder 174, an upper power feed rod 176, and a matching unit 178. The high-frequency power source 172 can output a high-frequency voltage having a frequency of 13 MHz (megahertz) or higher (e.g. 60 MHz), or can output a very high frequency (VHF) voltage having a frequency of 30-300 MHz. This power source 172 can be referred to as the main power supply as compared to a bias power supply. The power feeder 174 can be formed into, e.g., a substantially cylindrical shape having an open lower surface. The power feeder 174 can be connected to the outer upper electrode 154 at the lower end portion thereof. The power feeder 174 is electrically connected with the lower end portion of the upper power feed rod 176 at the center portion of an upper surface thereof. The upper power feed rod 176 is connected to the output side of the matching unit 178 at the upper end portion thereof. The matching unit 178 is connected to the high-frequency power source 172 and can match load impedance with the internal impedance of the high-frequency power source 172. Note, however, that outer upper electrode 154 is optional and embodiments can function with a single upper electrode.

Power feeder 174 can be cylindrical having a sidewall whose diameter is substantially the same as that of the plasma processing chamber 102. The ground conductor 180 is connected to the upper portion of a sidewall of the plasma processing chamber 102 at the lower end portion thereof. The upper power feed rod 176 passes through a center portion of the upper surface of the ground conductor 180. An insulating member 182 is interposed at the contact portion between the ground conductor 180 and the upper power feed rod 176.

The electrode support 160 is electrically connected with a lower power feed rod 184 on the upper surface thereof. The lower power feed rod 184 is connected to the upper power feed rod 176 via a connector. The upper power feed rod 176 and the lower power feed rod 184 form a power feed rod for supplying high-frequency electric power from the high-frequency power source 172 to the upper electrode 150. A variable condenser 186 is provided in the lower power feed rod 184. By adjusting the capacitance of the variable condenser 186, when the high-frequency electric power is applied from the high-frequency power source 160, the relative ratio of an electric field strength formed directly under the outer upper electrode 154 to an electric field strength formed directly under the inner upper electrode 172 can be adjusted. The inner upper electrode 152 of the upper electrode 150 is electrically connected with a low pass filter (LPF) 188. The LPF 188 blocks high frequencies from the high-frequency power source 172 while passing low frequencies from the high-frequency power source 130 to ground. A lower portion of the system, the susceptor 108, forming part of the lower electrode 120, is electrically connected with a high pass filter (HPF) 190. The HPF 190 passes high frequencies from the high-frequency power source 172 to ground.

Components of the plasma processing system 100 can be connected to, and controlled by, a control unit 192, which in turn can be connected to a corresponding storage unit 194 and user interface 196. Various plasma processing operations can be executed via the user interface 196, and various plasma processing recipes and operations can be stored in storage unit 194. Accordingly, a given substrate can be processed within the plasma processing chamber with various microfabrication techniques. In operation, the plasma processing apparatus uses the upper and lower electrodes to generate a plasma in the processing space PS 106. This generated plasma can then be used for processing a target substrate (such as substrate W 110 or any material to be processed) in various types of treatments such as plasma etching, chemical vapor deposition, treatment of glass material and treatment of large panels such as thin-film solar cells, other photovoltaic cells, and organic/inorganic plates for flat panel displays, etc.

The control unit 192 may include one or more processors, microcomputers, computing units and the like. The storage unit 194 may include memory, and is an example of non-transitory computer-readable storage media for storing instructions which are executed by the control unit 192, to perform the various functions described herein. For example, the storage unit 194 may generally include both volatile memory and non-volatile memory (e.g., RAM, ROM, or the like). Memory may be referred to as memory or computer-readable storage media herein. Memory is capable of storing computer-readable, processor-executable program instructions as computer program code that may be executed by the control unit 190 as a particular machine configured for carrying out the operations and functions described in the implementations herein.

Memory may further store one or more applications (not shown). The applications may include preconfigured/installed and downloadable applications.

In certain implementations, localized (ultra-localized) plasma sources 198 are located to address uniformity in the wafer fabrication process. Such localized plasma sources 198 can be placed towards the edge of substrate W 110. In particular, localized plasma sources 198 or an array of such structures is located at an edge of a wafer die platform of the plasma processing system or apparatus 100. For example, localized plasma sources 198 or an array of such structures can influence the extreme edge of the plasma by locating such localized plasma sources 198 in a narrow gap reactor above the wafer W 110 edge. In certain implementations, radially radiating linear or circumferential arrays of plasma sources 198 can be used to produce a spatially controllable plasma over entire wafer W 110.

Figure 2:
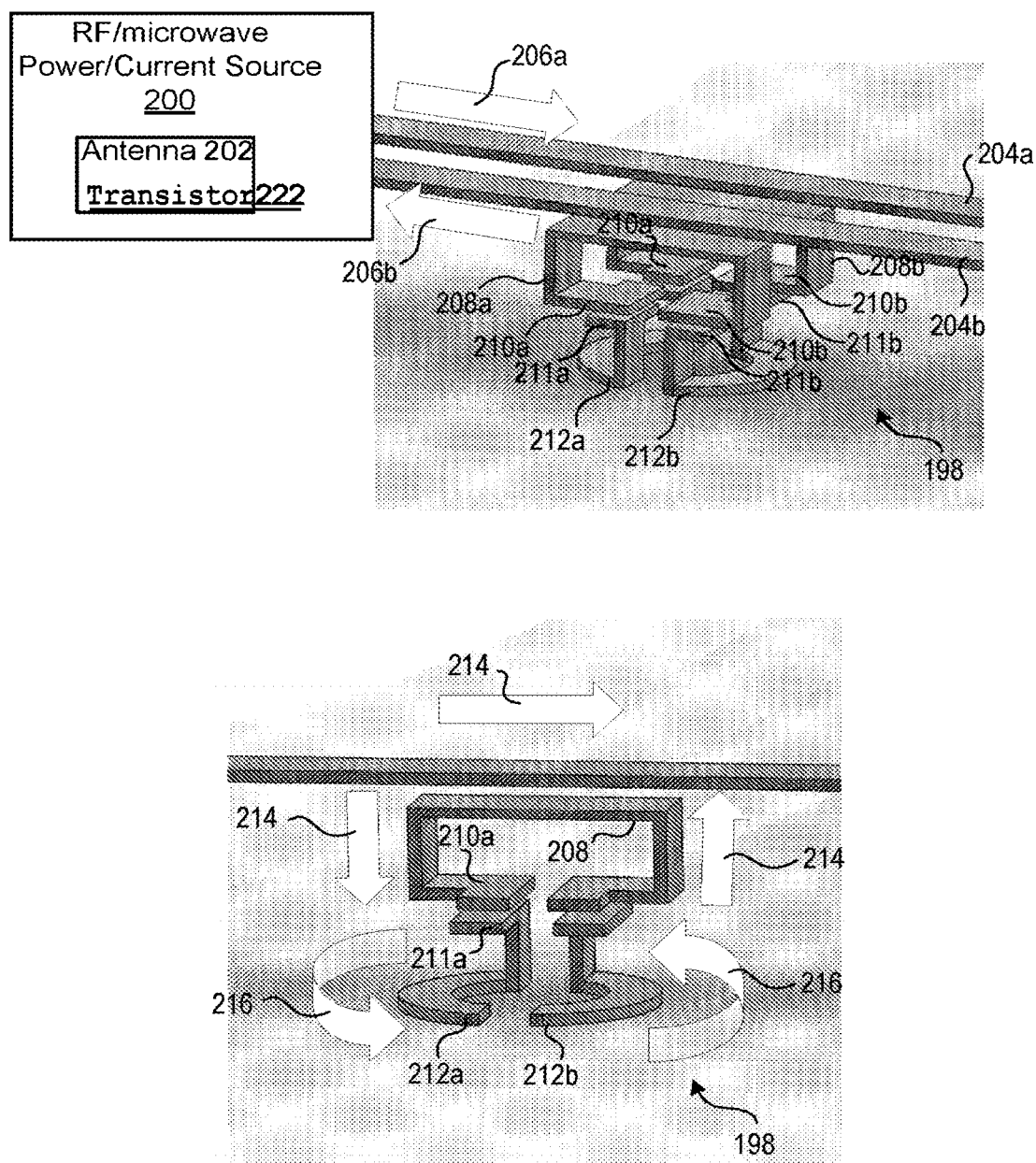
FIG. 2 is an example schematic configuration of a localized plasma source or resonant structure/element.

FIG. 2 shows an example of a localized plasma source or resonant element 198. Plasma source or element 198 can be part of an array of plasma sources or resonant elements as further described below. Plasma source or element 198 can be considered as a resonant structure that is driven by RF or microwave power or current source 200. The power source 200 may be directly coupled to the resonant element 198 or indirectly coupled through an antenna 202. In certain implementations, the resonant element or structure 198 is capacitively coupled to the power or current source 2000. Power or current source 200 may be a single power generator. In certain embodiments, the resonant element 198 will have a quadrupole symmetry. In this example, the portion of the antenna 202 exciting each resonant element 198 will also have a matching quadrupole symmetry. Antenna 202 may be an array of antennas. Antenna or an array of antennas can either operate in a continuous wave (CW) or a pulsed manner. A pulse manner can allow higher peak powers.

Plasma source or resonant element 198 as part of an array of resonant structures may be driven with power or current source 200 in the VHF (30-300 MHz), the UHF band (300 MHz to 1 GHz), L band (1-2 GHz), S band (2-4 GHz), C band (4 GHz to 8 GHz), X band (8 GHz to 12 GHz). In particular, a radio frequency (RF) of interest charges the plasma source or resonant element 198 and the frequency of interest is determined by the resonant frequency of the individual elements which in turn depend on their geometry and the dielectric medium surrounding them.

In the implementation shown in FIG. 2, the current source 200 transmits along parallel conductors which are shown in this implementation as rails with a rectangular cross section 204a and 204b. This pair of rails 204a and 204b form transverse electromagnetic (TEM) transmission lines. Respective current flows in the TEM rails 204a and 204b are represented by arrows 206a and 206b.

For clarity, a partially illustrated drawing of the plasma source or resonant element 198 is shown at the bottom of FIG. 2. Only the rear part of the structure is shown in order to enhance readability. In this example, the partially illustrated resonant element 198 has two mirror symmetry planes; however, other non-symmetric configurations may be implemented. The plasma source or element 198, includes a pair of magnetic coupling coils 208a and 208b which couple the resonant element 198 to the main transmission line by TEM rails 204a and 204b. Each of the magnetic coupling coils 208a and 208b terminates in a pair of capacitive components as represented by top plates 210a and 210b, and bottom plates 211a and 211b. Therefore, each capacitive element respectively includes a top plate 210a and 210b, and a bottom plate 211a and 211b. In this example, the bottom plates 211 of the two capacitive elements are each connected to one end each of two half circle loops acting as inductive components and represented as 212a and 212b. Therefore, they are two inductive loops. Each inductive loop has two ends, or four ends altogether. These four ends are connected to the four capacitive elements 210 and 211.

Capacitive elements 210 and 211 and their corresponding inductive components 212*a* and 212*b* form an LC circuit. In such a resonant circuit, stored energy is exchanged between the capacitors and the inductors at the resonant frequency. In certain implementations, the inductive 212*a* and 212*b* and capacitive components 210 and 211 of the array have identical dimensions. In certain implementations, the inductive 212*a* and 212*b* and capacitive components 210 and 211 of the array have different dimensions. The resonant element 198 is located in such a way that the changing magnetic fields produced by the inductive elements 212*a* and 212*b* extend into the processing region PS 106; the changing magnetic fields by Faraday's law induce a changing electric field and this changing electric field couples power to electrons in the plasma and thereby enables the plasma to be created and sustained The geometric size of the resonant structures may be equal or considerably smaller than the free space wavelength of the electromagnetic radiation at the resonant frequency. In the case that the lower loop formed by the inductive elements 212*a* and 212*b* lies in a plane which is parallel to the plane formed by the interface between the nearby plasma and a solid surface, the induced electric field is parallel to the plasma interface and therefore its amplitude is continuous at the plasma interface and it is able to penetrate into the plasma.

In the embodiment shown in FIG. 2 the electromagnetic power is coupled to the resonant structure inductively through the top inductive loops 208. However, the electromagnetic power may also be capacitive coupled directly to the four capacitive elements 210*a*, 210*b*, 211*a* and 211*b*. Electromagnetic power may also be coupled in a combined capacitive-inductive manner. It is not particular that the resonant element 198 have a quadrupole symmetry or mirror symmetry.

The resonant structure 198 can be driven so that the driving frequency would be near the resonant frequency of other resonant structure(s) 198. In the presence of plasma, the resonant frequency of the resonant structure 198 may depart from an original resonant frequency. If the power continues to be delivered at the original resonant frequency, less power would be delivered to the plasma source or resonant structure 198. Since plasma density is typically proportional to the radio frequency (RF) power, a reduction in power to an element (i.e., plasma source or resonant structure 198) can lead to a reduction in the density sustained by that element (i.e., plasma source or resonant structure 198). In an array of plasma sources or resonant structures 198, this ensures a negative feedback to the plasma density which prevents one of the plasma sources or resonant structures 198 from dominating over the resonant structures or plasma sources 198 in the array. This ensures that all the structures or plasma sources 198 or an array will ignite and have roughly the same power delivered to each structure or plasma source 198. However, in other embodiments, a power distribution component may be disposed between the power supply and the structures to vary the power and/or frequency to one or more of the structures. For example, the power distribution component may include one or more transistors 222 arranged to alter the power and/or frequency of the power signal provided by the power supply.

The size of a resonant structures 198 may influence its resonant frequency. Smaller structures have higher resonant frequencies. At the low frequency end, the size of the resonant structures 198 is limited by the geometric size of the reactor which typically is some multiple of a wafer dimension of 300 mm. A resonant structure with an extent of 200 mm has a resonant frequency of 55 MHz when embedded in alumina. In comparison, the half free space wavelength of 55 MHz is 2727 mm. In certain implementations, the resonant frequency is approximately 2 to 8 GHz. In certain implementations, the resonant frequency is approximately 100 MHz to 15 GHz. In certain implementations, the resonant frequency is determined by the arrangement and dimensions of the capacitive and inductive components.

Topologically, such a structure is identical to the resonant structures 198, operating at higher frequency. Such a structure can include two loops each of which terminates at either end in a capacitive structure. There is a mutual capacitive coupling between the two loops. This splits the degeneracy of the direction of current circulation and permits either parallel or anti-parallel current flows depending on the frequency of excitation. The folded structure of the capacitive element increases the capacitance without increasing the geometric size of the structure. In a cylindrical geometry these structures would be curved so as to lie on a portion of a circle. For example, a set of one or more of such structures can encircle the axis of symmetry of the reactor at a particular radius forming a segmented annulus. A set of such segmented annuli at different radii cover for example the top electrode of the reactor. It is important to note that the small size of the structures compared to the free space half wavelength means that these structures do not couple to free space electromagnetic waves. The fields which couple to the plasma are the near fields produced as currents pass from capacitor to capacitor through the inductor. We have chosen the orientation of the structures such that the inductive elements are closest to the plasma; this means that the fields which reach the plasma region are primarily due to electric fields induced by the changing magnetic fields which are in turn produced by the currents passing through the inductive portion of the structure. In an anti-parallel mode of operation, these fields die away rapidly from the resonant element while in a parallel mode of operation they extend further into the plasma region. Thus by changing the excitation frequency the penetration of the electric fields and thus the plasma generating region can be changed. By simultaneously exciting both frequencies at different amplitudes it is possible to control the penetration depth of the exciting fields arbitrarily.

It is contemplated that resonant structures 198 can be oriented such that the capacitive elements are closest to the plasma; which can allow coupling to the plasma to be from near fields produced by the capacitive elements. These generally are polarized perpendicular to the plasma surface while the inductive fields discussed above for the geometries shown are parallel to the plasma surface.

At the upper end of the frequency range sizes smaller than approximately 10 mm may be less useful, since the plasmas created by such resonant structures at the pressures typically used in plasma processing are of that size or larger. In applications where a very localized plasma is desired, small structures and therefore high frequencies may be required. In the case of a very localized plasma, it may be desirable for the plasma to be both small and to have a relatively high plasma density. This may be particularly implemented in order to be able to have a measurable effect on some portion of the wafer. A particular benefit of operation at high frequencies is that the small size of the resonant structure 198 operates at a high frequency, and high frequencies typically produce higher plasma densities. This is because higher frequencies couple power preferentially to electron heating rather than in the acceleration of ions and higher frequencies are able to propagate into higher density plasmas.

In situations in which it is desirable to have localized plasmas it is beneficial for the resonant elements not to excite surface modes which propagate along the interface between the plasma and a solid wall. Such modes propagate away from the resonant element and are difficult to control. The elements shown in FIG. 2) have a quadrupole symmetry and produce an electric field pattern which does not couple well to the surface modes. Rather the electric field pattern produced by this quadrupole resonant structure geometry will produce a current ring below the bottom two half loops.

The size of the structure or plasma source 198 is on the order of 10 mm, approximately a quarter wavelength of the radio frequency (RF) of interest. The capacitive components 210a and 210b and inductive components 212a and 212b can be approximately 4 mm to 8 mm in width.

Figure 3:
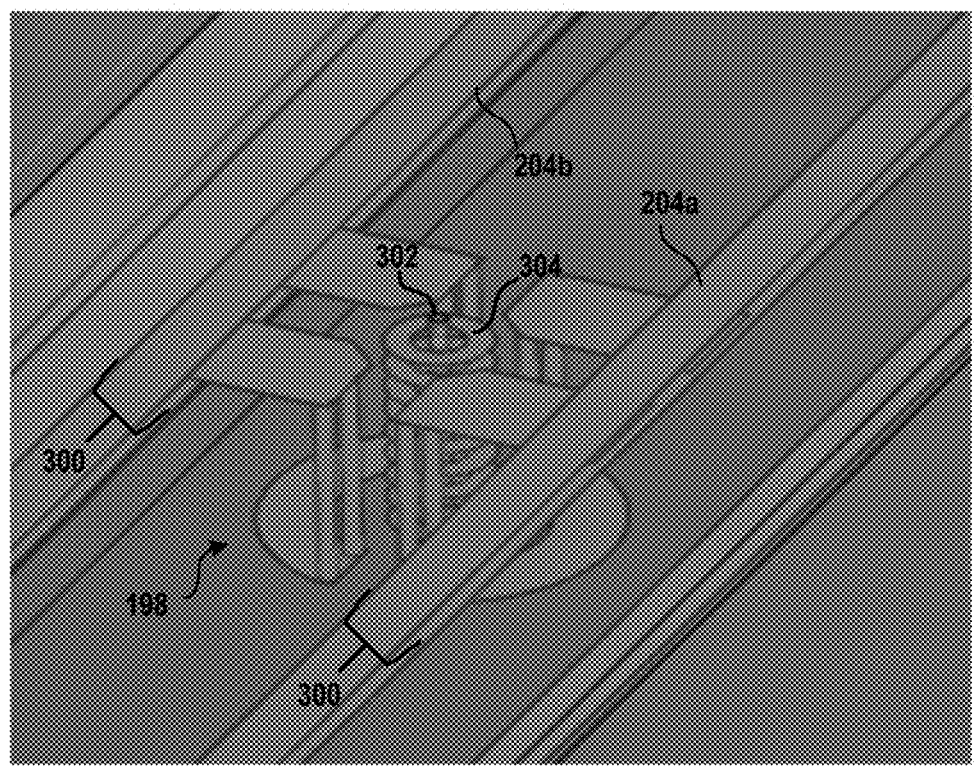
FIG. 3 is an example schematic configuration of a localized plasma source or element with a gas inlet and guard.

FIG. 3 shows a localized plasma source or element with a gas inlet and guard. A structure or plasma source 198 is shown connected to TEM rails 204a and 204b. The width of TEM rails is represented as 300, where such widths 300 can be approximately 2 mm.

A gas injection hole 302 may be included in the structure or plasma source 198 to allow the injection of localized gas into the high density plasma provided by the plasma source 198, thus producing radicals. In other words, each localized plasma source 198 excites the localized gas that is introduced at the respective plasma source 198. In a wafer fabrication process, a working gas is introduced in order to form radicals. The gas is blown through the plasma allowing electrons to react with the gas molecules, thereby dissociating them and forming reactive species. The gas injection hole 302 may receive the reactive gas from the gas supply line 140 may be part of the gas inlets 158 as described in FIG. 1 above.

In certain implementations, a gas hole ignition suppressor structure 304 may be included, shielding the gas injection hole. The suppressor structure 304 is used to prevent inadvertent ignition within the structure or plasma source 198. The suppressor structure 304 effectively can act as a shield from magnetic or electrical fields that can cause inadvertent ignition within the gas injection hole 302. In the cases that the resonant structure has a quadrupole symmetry, such a suppressor structure is not required because by symmetry there is no oscillating electric field within the gas injection hole parallel to the axis of that hole.

Figure 4:
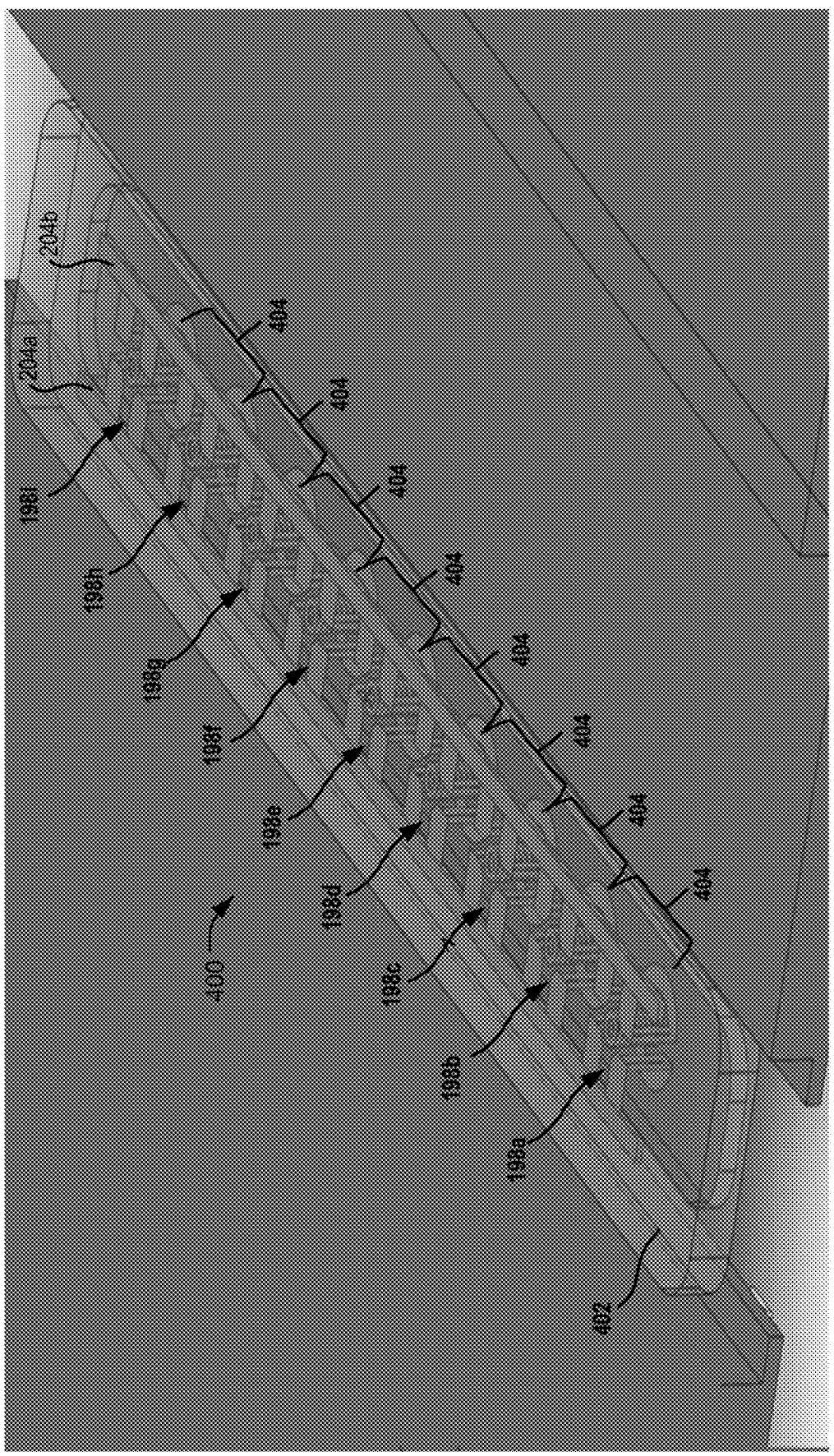
FIG. 4 is an example schematic configuration of an array of localized plasma sources or elements.

FIG. 4 shows an array of localized plasma sources or elements. An array 400 includes multiple structures or plasma sources that are identified as 198a, 198b, 198c, 198d, 198e, 198f, 198g, 198h, and 198i. In certain implementations, the array 400 be encased in a ceramic 402. The ceramic 402 includes alumina. Encasing in ceramic can assure that the array is plasma compatible. The surface of the ceramic 402 should be smooth to avoid localized stress concentrations.

As discussed above in reference to FIG. 1, in an implementation, the array 400 may be located at an edge of a wafer die platform of the plasma processing system or apparatus 100. In certain implementations, the array 400 (or arrays) is (are) placed at various locations of a wafer die platform of the processing system or apparatus 100.

In the array 400 the resonant elements 198 are coupled by a pair of TEM transmission lines 204a and 204b. It is contemplated that other configurations are possible, where power is coupled to the resonant elements 198 by a branching network. It is also possible that each resonant element 198 is driven by its own power source, where such a power source could for example be a pair of transistors. Spacing 404 of the structures or plasma sources may be determined based on a frequency (RF) of interest. The choice of frequency range can be chosen based on the wavelength. When the wavelength of the sustaining RF power is comparable or smaller to one of the geometric dimensions of the reactor or system 100, the plasma will tend to form "modes" where the shape of the mode is determined by the propagation characteristics of the electromagnetic wave in the presence of the plasma. In the microwave range of 2-8 GHz, the wavelengths are smaller than or comparable to the gap in typical CCP reactors. It may be desired to place the resonant elements close enough together that their effect on the wafer is continuous, therefore this higher frequency range may be preferable.

At high frequencies unless there are geometric structures which select one mode, there a usually a number of modes with different patterns with very close frequencies. The non-linear nature of the field-plasma coupling causes transitions between these modes which may be difficult to control. These difficulties place constraints on the usefulness of 2.45 GHz reactors. Geometric resonant structures may be selected on a particular operating mode, and may therefore avoid mode hopping problems. It would be possible to go to higher frequencies which would make the resonant structures more compact.

For example, at a radio frequency (RF) of interest of 5 GHz, an array 400 encased in alumina 402 would have a wavelength of 10 mm. The spacing 404 between resonant structures or plasma sources 198 would be about 10 mm. Since the magnetic field from the RF/microwave power/current source 200, as described above in FIG. 2, is a sinusoidal wave, the resonant structures or plasma sources 198 can be spaced at anti-node distances from one another. In particular, the resonant structures or plasma sources 198 can be placed at magnetic field anti-nodes along the TEM rails 204a and 204b.

Although the structures shown in FIG. 4 are linear, their implementation in a reactor can have many other geometries for example, the arrays could be arranged along an arc or the resonant element in FIG. 6 can be in the form of an arc or a complete circle so that arrays of one or more of these elements could excite a plasma which was substantially axisymmetric. Successive arrays with disposed along larger radii arcs could then be used to provide coverage over an entire semiconductor wafer.

Because the resonant elements' resonant frequencies are dependent on their geometries, it is possible for each resonant element to have a different resonant frequency. It would thereby be possible to selectively excite particular resonant elements or particular arrays of resonant elements by choosing different exciting frequencies. The individual or arrays of elements could be excited in either a time-division or multiple simultaneous frequency manner; in the case of excitation by multiple simultaneous frequencies, the amplitude of each frequency could be adjusted in order to control the plasma spatial uniformity. In the case of time-division or pulsed excitation, the sequencing of the pulses could be coordinated with other time dependent processes such as RF biasing of the lower electrode or time dependent injection of process gases. This would allow control of various properties and in particular the spatial profile of the plasma.

Figure 5:
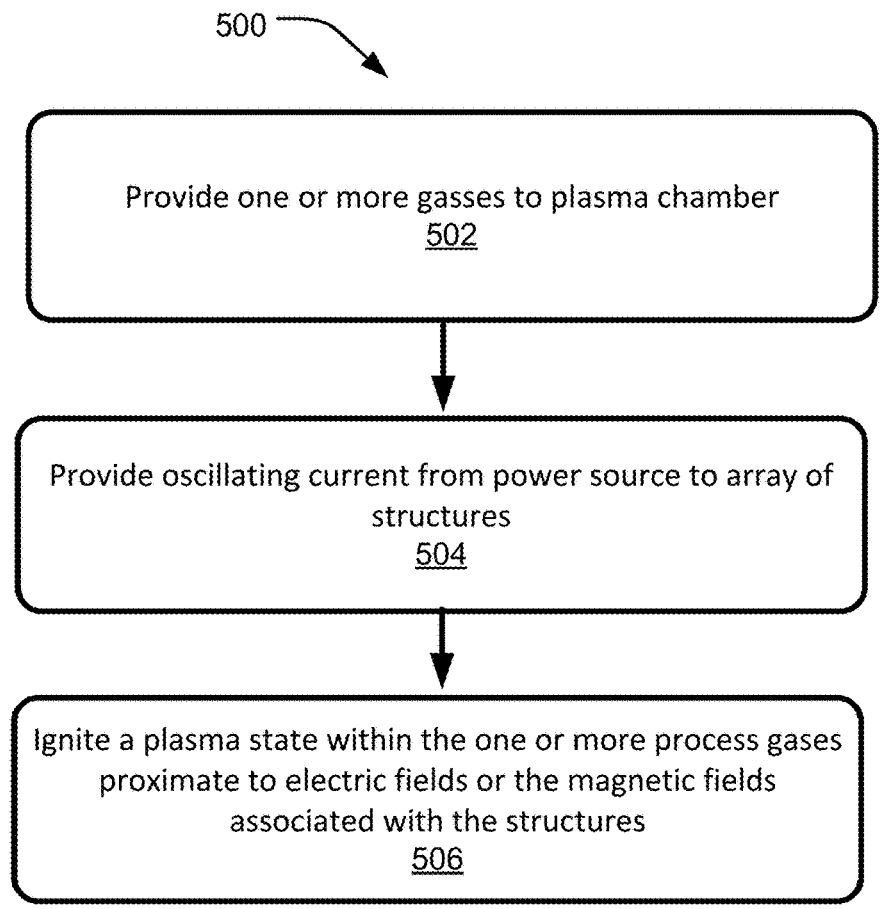
FIG. 5 shows an example process implementing ultra-localized plasma sources and uniformity control.

FIG. 5 shows an example process 500 for implementing ultra-localized plasma sources and uniformity control. In particular, the process can be used for pattern transfer in a wafer etching process. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 502, one or more gases are provided to a plasma chamber. The plasma chamber includes an array of structures disposed within a plasma chamber, each structure including a capacitive (C) component and an inductive (L) component that form a resonant circuit.

At block 504, an oscillating current is provided from a power source to the array of structures. The oscillating current charges the capacitive (C) component at a resonant frequency to create an electric field proximate to the capacitive component (C), the electric field induces a magnetic field proximate to the inductive (L) component. The oscillating current can include a current wave that determines the location of the structures from one another. The resonant frequency may be determined based on the dimensions of the structures. The structures can have similar mechanical dimensions to on another.

At block 506, a plasma state is charged within the one or more process gases proximate to the electric fields or the magnetic fields associated with the structures.

What is claimed is:

1. An apparatus for generating plasma in a plasma processing system, comprising:
    an upper electrode including an inner upper electrode and an outer upper electrode surrounding a periphery of the inner upper electrode, wherein the inner upper electrode includes a processing gas inlet and includes an electrode plate;
    an array of three or more localized structures arranged within a periphery of the electrode plate, wherein the inner upper electrode comprises the array of three or more localized structures; and
    a power supply coupled to the array of localized structures through at least one upper inductive loop and a transmission line, each localized structure having a resonant frequency to generate spatially controllable plasma,
    wherein each of the localized structures includes: first and second capacitive components and respective two lower half circle inductive loops, wherein the first and second capacitive components each have two top plates coupled to the transmission line and two bottom plates, the bottom plates of the first and second capacitive components are each connected to respective ends of the two lower half circle inductive loops, wherein the two lower half circle inductive loops are electrically coupled,
    wherein the two lower inductive loops and the first and second capacitive components form a resonant circuit, and are configured as a closed circuit such that stored energy is exchanged between the first and the second capacitive components and the two lower inductive loops at the resonant frequency,
    wherein the two lower inductive loops are two half circle plates, and
    wherein the power supply is configured to power the resonant circuit to generate the plasma.

2. The apparatus of claim 1, wherein the power supply is capacitively coupled to the array of localized structures.

3. The apparatus of claim 1, wherein the top plates and the bottom plates of the first capacitive component are folded in an inward direction and the top plates and the bottom plates of the second capacitive component are folded in an inward direction, wherein the inward direction is such that the direction of fold of the top plates of the first capacitive component is toward the direction of fold of the top plates of the second capacitive component.

4. The apparatus of claim 1, wherein the lower inductive loops and the capacitive components of each of the array of localized structures have identical dimensions.

5. The apparatus of claim 1, wherein the lower inductive loops and the capacitive components of one or more of the array of localized structures have different dimensions.

6. The apparatus of claim 1, wherein the array of localized structures is encased in a ceramic.

7. The apparatus of claim 6, wherein the ceramic is alumina.

8. The apparatus of claim 1, further comprising a substrate chuck disposed opposite or adjacent to the array of localized structures.

9. The apparatus of claim 1, further comprising a substrate chuck disposed in the apparatus, wherein the array of localized structures is disposed around the substrate chuck.

10. The apparatus of claim 1, wherein the resonant frequency is approximately 2 to 8 GHz.

11. The apparatus of claim 1, wherein the resonant frequency is approximately 100 MHz to 15 GHz.

12. The apparatus of claim 1, wherein each of the capacitive components and the lower inductive loops of the array of localized structures are approximately 4 mm to 8 mm in width.

13. The apparatus of claim 1, wherein each of the array of localized structures are spaced approximately 10 mm from one another.

14. The apparatus of claim 1, further comprising a local gas source included in each of the array of localized structures, wherein a gas is introduced at each of the local sources and excited by each of the array of localized structures.

15. The apparatus of claim 14, wherein each of the local gas sources includes a guard to prevent inadvertent ignition within the structure.

16. The apparatus of claim 1, further comprising a power distribution component disposed between the power supply and the array of localized structures, the power distribution component being configured to vary power or frequency applied to one or more of the structures within the array of localized structures.

17. The apparatus of claim 16, wherein the power distribution component comprises at least one transistor electrically coupled to at least one of the array of localized structures.

18. The apparatus of claim 1, wherein the array of localized structures comprise similar mechanical dimensions for each of the array of localized structures.

19. The apparatus of claim 1, wherein the array of localized structures comprises at least one structure having different mechanical dimensions than other structures within the array of localized structures.

20. An apparatus for generating plasma in a plasma processing system, comprising:
    an upper electrode including an inner upper electrode and an outer upper electrode surrounding a periphery of the inner upper electrode, wherein the inner upper electrode includes a processing gas inlet and an electrode plate; and
    an array of three or more localized structures arranged in an outer periphery region of the electrode plate and adjacent to an inner edge of the outer upper electrode, wherein the array of three or more localized structures is located above an edge of a wafer die platform of the plasma processing system;

wherein each of the localized structures includes: first and second capacitive components and corresponding inductive loops disposed adjacent to their respective capacitive component, wherein the first and second capacitive components each have two top plates coupled to a transmission line and two bottom plates, the bottom plates of the first and second capacitive components are each connected to respective ends of two lower half circle inductive loops, wherein the two lower half circle inductive loops are electrically coupled, and wherein the two lower inductive loops and the first and second capacitive components form a resonant circuit, and are configured as a closed circuit such that stored energy is exchanged between the first and the second capacitive components and the two lower inductive loops at a resonant frequency.

* * * * *